(12) United States Patent
Ko et al.

(10) Patent No.: US 7,888,267 B2
(45) Date of Patent: Feb. 15, 2011

(54) METHOD FOR ETCHING SILICON-CONTAINING ARC LAYER WITH REDUCED CD BIAS

(75) Inventors: Akiteru Ko, Peabody, MA (US); Christopher Cole, Middleton, MA (US)

(73) Assignee: Tokyo Electron Limited, Tokyo (JP)

( * ) Notice: Subject to any disclaimer, the term of this patent is extended or adjusted under 35 U.S.C. 154(b) by 640 days.

(21) Appl. No.: 12/024,258

(22) Filed: Feb. 1, 2008

(65) Prior Publication Data
US 2009/0194503 A1    Aug. 6, 2009

(51) Int. Cl.
*H01L 21/302* (2006.01)
*H01L 21/461* (2006.01)

(52) U.S. Cl. ............... 438/706; 438/719; 216/47

(58) Field of Classification Search ............ 438/706, 438/694, 719; 216/41, 47
See application file for complete search history.

(56) References Cited

U.S. PATENT DOCUMENTS

| | | | |
|---|---|---|---|
| 6,599,437 B2 * | 7/2003 | Yauw et al. | 216/47 |
| 7,531,461 B2 * | 5/2009 | Ko | 438/719 |
| 2002/0142252 A1 * | 10/2002 | Ng | 430/313 |

* cited by examiner

*Primary Examiner*—Roberts Culbert

(57) ABSTRACT

A method of dry developing a multi-layer mask having a silicon-containing anti-reflective coating (ARC) layer on a substrate is described. The method comprises forming the multi-layer mask on the substrate, wherein the multi-layer mask comprises a lithographic layer overlying the silicon-containing ARC layer. A feature pattern is then formed in the lithographic layer using a lithographic process. Thereafter, the feature pattern is transferred from the lithographic layer to the silicon-containing ARC layer using a dry plasma etching process, wherein the offset in the critical dimension (CD) bias is reduced between nested structures and isolated structures.

20 Claims, 11 Drawing Sheets

ND FOR ETCHING
METHOD FOR ETCHING SILICON-CONTAINING ARC LAYER WITH REDUCED CD BIAS

BACKGROUND OF THE INVENTION

1. Field of Invention

The invention relates to a method for etching a feature in a silicon-containing anti-reflective coating (ARC) layer on a substrate, and more particularly to a method for etching a feature in a silicon-containing ARC layer while reducing a critical dimension (CD) bias.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material. For example, on a semiconductor substrate, a pattern formed in a protective layer can be transferred to an underlying layer of a selected material utilizing a plasma etching process. The protective layer can comprise a radiation-sensitive layer, such as a photo-resist layer, having a pattern formed therein using a lithographic process. The protective layer can also comprise an anti-reflective coating (ARC) layer underlying the resist layer, wherein the pattern formed in the resist layer is transferred to the underlying ARC layer. During the transfer of the pattern from the resist layer to the ARC layer, it is desirable to maintain or reduce the critical dimension (CD) of the pattern. Additionally, it is desirable to achieve a uniform distribution of the CD bias (difference between the initial and final CD during pattern transfer) across the substrate. Furthermore, it is desirable to achieve the same CD bias for both nested (closely spaced) structures and isolated (widely spaced) structures.

SUMMARY OF THE INVENTION

The invention relates to a method for etching a feature in a substrate.

Additionally, the invention relates to a method for etching a feature in a silicon-containing anti-reflective coating (ARC) layer on a substrate, and more particularly to a method for etching a feature in a silicon-containing ARC layer while reducing a critical dimension (CD) bias.

Furthermore, the invention relates to a method of dry developing a multi-layer mask having a silicon-containing anti-reflective coating (ARC) layer on a substrate. The method comprises forming the multi-layer mask on the substrate, wherein the multi-layer mask comprises a lithographic layer overlying the silicon-containing ARC layer. A feature pattern is then formed in the lithographic layer using a lithographic process. Thereafter, the feature pattern is transferred from the lithographic layer to the silicon-containing ARC layer using a dry plasma etching process, wherein the offset in the critical dimension (CD) bias is reduced between nested structures and isolated structures.

According to one embodiment, a method of dry developing an anti-reflective coating (ARC) layer on a substrate is described, comprising: disposing a substrate comprising a multi-layer mask in a plasma processing system, wherein the multi-layer mask comprises a lithographic layer overlying a silicon-containing ARC layer and wherein the lithographic layer comprises a feature pattern formed therein using a lithographic process; establishing a process recipe configured to cause a reduction in an offset between a first critical dimension (CD) bias for nested structures in the feature pattern and a second CD bias for isolated structures in the feature pattern, wherein the first CD bias is measured as a first difference between a first CD for nested structures of the feature pattern in the lithographic layer and a second CD for nested structures of the feature pattern in the silicon-containing ARC layer and the second CD bias is measured as a second difference between a first CD for isolated structures of the feature pattern in the lithographic layer and a second CD for isolated structures of the feature pattern in the silicon-containing ARC layer; introducing a process gas to the plasma processing system according to the process recipe, the process gas comprising $SF_6$; forming plasma from the process gas in the plasma processing system according to the process recipe; and exposing the substrate to the plasma in order to transfer the feature pattern in the lithographic layer to the underlying silicon-containing ARC layer.

According to another embodiment, a method of dry developing a multi-layer mask on a substrate is described, comprising: forming the multi-layer mask on the substrate, wherein the multi-layer mask comprises a lithographic layer overlying a silicon-containing ARC layer which is overlying an organic dielectric layer (ODL); forming a feature pattern in the lithographic layer using a lithographic process; transferring the feature pattern from the lithographic layer to the silicon-containing ARC layer using a first dry plasma etching process, wherein the first dry plasma etching process comprises introducing a process gas having $SF_6$, forming plasma from the process gas, and exposing the substrate to the plasma; transferring the feature pattern from the silicon-containing ARC layer to the ODL using a second dry plasma etching process, wherein the second dry plasma etching process comprises introducing a second process gas having $CO_2$, forming a second plasma from the second process gas, and exposing the substrate to the second plasma; and reducing an offset between a first critical dimension (CD) bias for nested structures in the feature pattern and a second CD bias for isolated structures in the feature pattern, wherein the first CD bias is measured as a first difference between a first CD for nested structures of the feature pattern in the lithographic layer and a second CD for nested structures of the feature pattern in the ODL and the second CD bias is measured as a second difference between a first CD for isolated structures of the feature pattern in the lithographic layer and a second CD for isolated structures of the feature pattern in the ODL.

DETAILED DESCRIPTION OF SEVERAL EMBODIMENTS

Figure 1A:
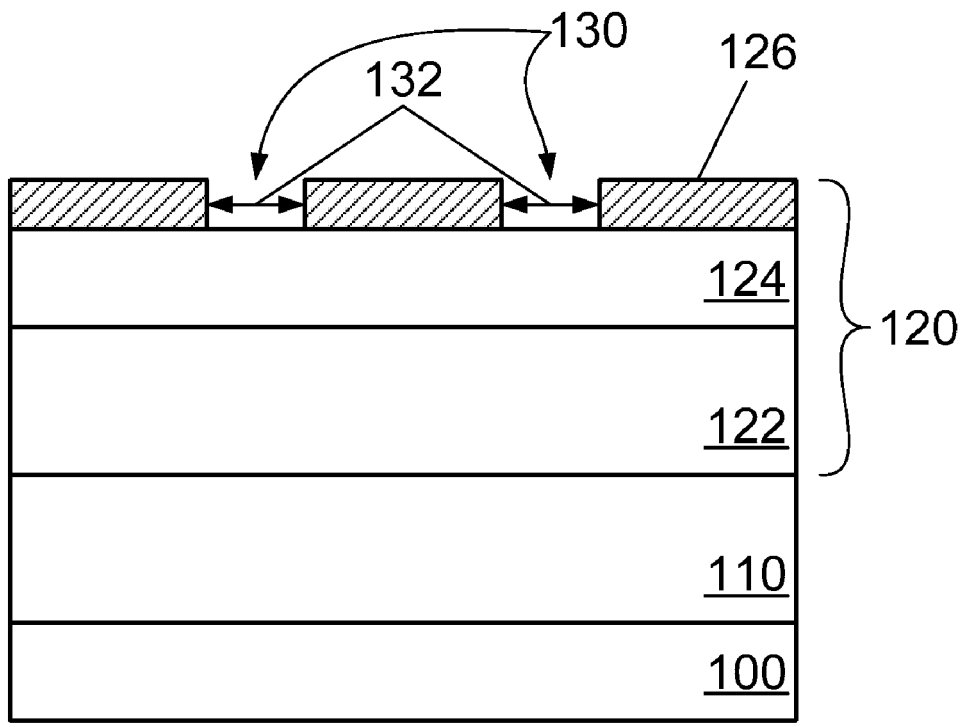
FIGS. 1A through 1E illustrate a schematic representation of a procedure for etching a feature in a substrate according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

In material processing methodologies, plasma is often utilized to create and assist surface chemistry on a substrate to facilitate the removal of material from the substrate or to facilitate film forming reactions for depositing material on the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

According to one example, pattern etching comprises the application of a lithographic layer, such as a thin layer of radiation-sensitive material (e.g., photo-resist), to an upper surface of a substrate that is subsequently patterned in order to provide a mask for transferring this pattern to the underlying thin film on the substrate during etching. The patterning of the radiation-sensitive material generally involves exposure of the lithographic layer to a geometric pattern of electromagnetic (EM) radiation using, for example, a micro-lithography system, followed by the removal of the irradiated regions of the radiation-sensitive material (as in the case of positive photo-resist), or non-irradiated regions (as in the case of negative resist) using a developing solvent.

In order to pattern thinner features in the lithographic layer using conventional lithography techniques, multi-layer masks can be implemented. For example, the multi-layer mask may include a bilayer mask or trilayer mask. With the inclusion of a second or third layer, the uppermost lithographic layer may be thinner than the thickness customarily chosen to withstand the subsequent dry etching process(es) and, therefore, using conventional lithography techniques, finer features may be formed in the thinner lithographic layer. Thereafter, the finer feature formed in the lithographic layer may be transferred to the underlying second or third layers using a dry development process, such as a dry etching process.

However, during pattern transfer, there exists a need to produce features in the multi-layer mask, wherein the critical dimension (CD) is uniformly maintained or reduced across the substrate. For example, it is desirable to produce a uniform distribution of the CD bias (i.e., the difference between the initial CD in the lithographic layer and the final CD in the underlying second or third layer) across the substrate (e.g., center to edge). Furthermore, during pattern transfer, there still exists a need to produce features in the multi-layer mask, wherein an offset between the CD bias for nested (closely spaced) structures and the CD bias for isolated (widely spaced) structures is minimized.

Hence, there still exists a need to correct for pattern deficiencies in the multi-layer mask, such as CD bias and CD bias offset (between nested and isolated structures). During pattern transfer, conventional process chemistries fail to reduce the CD bias and the CD bias offset.

Figure 1B:
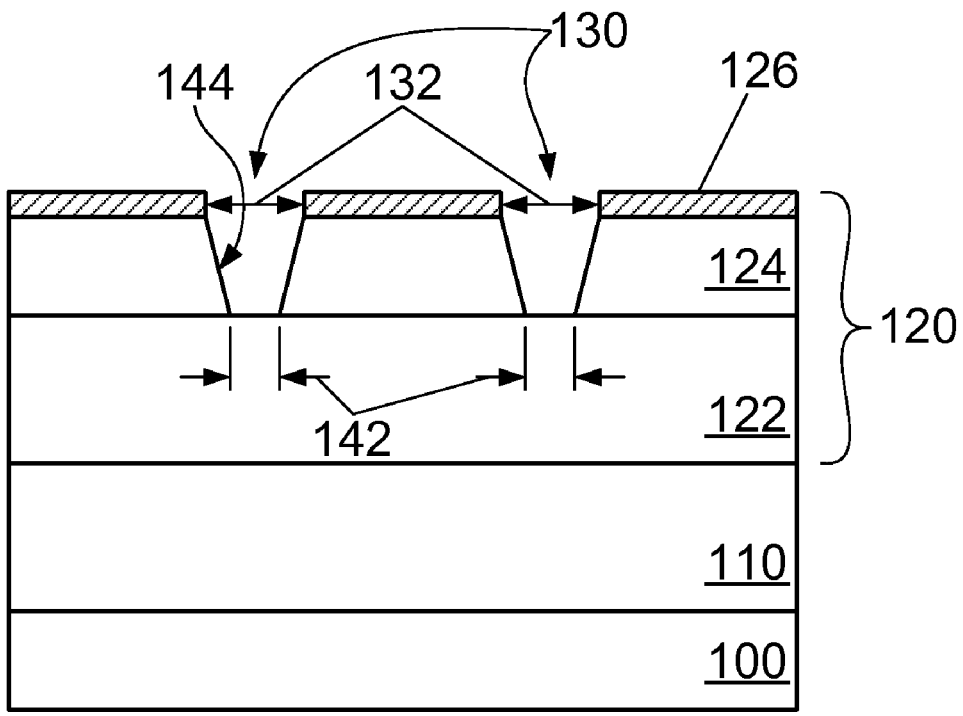
Figure 1C:
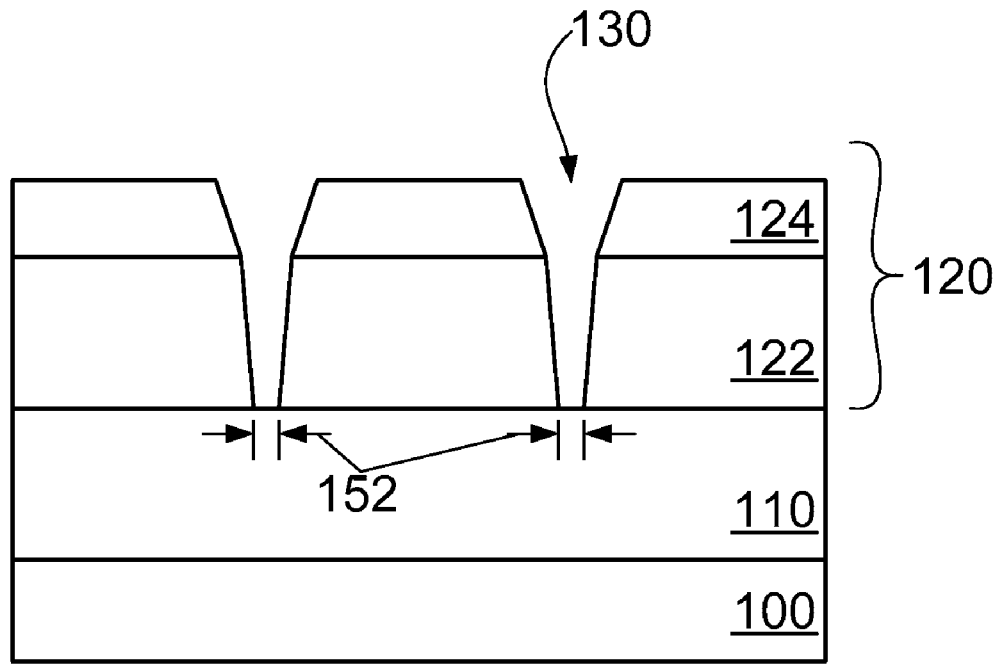
Figure 1D:
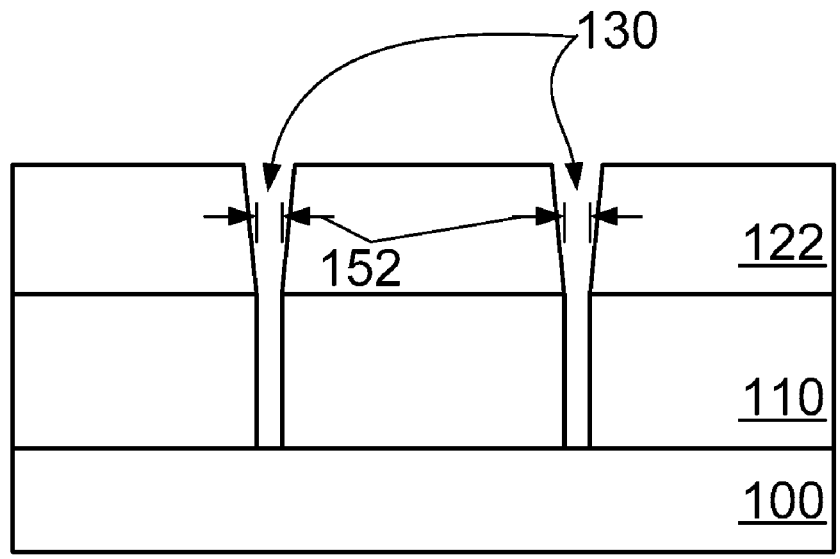
Figure 2:
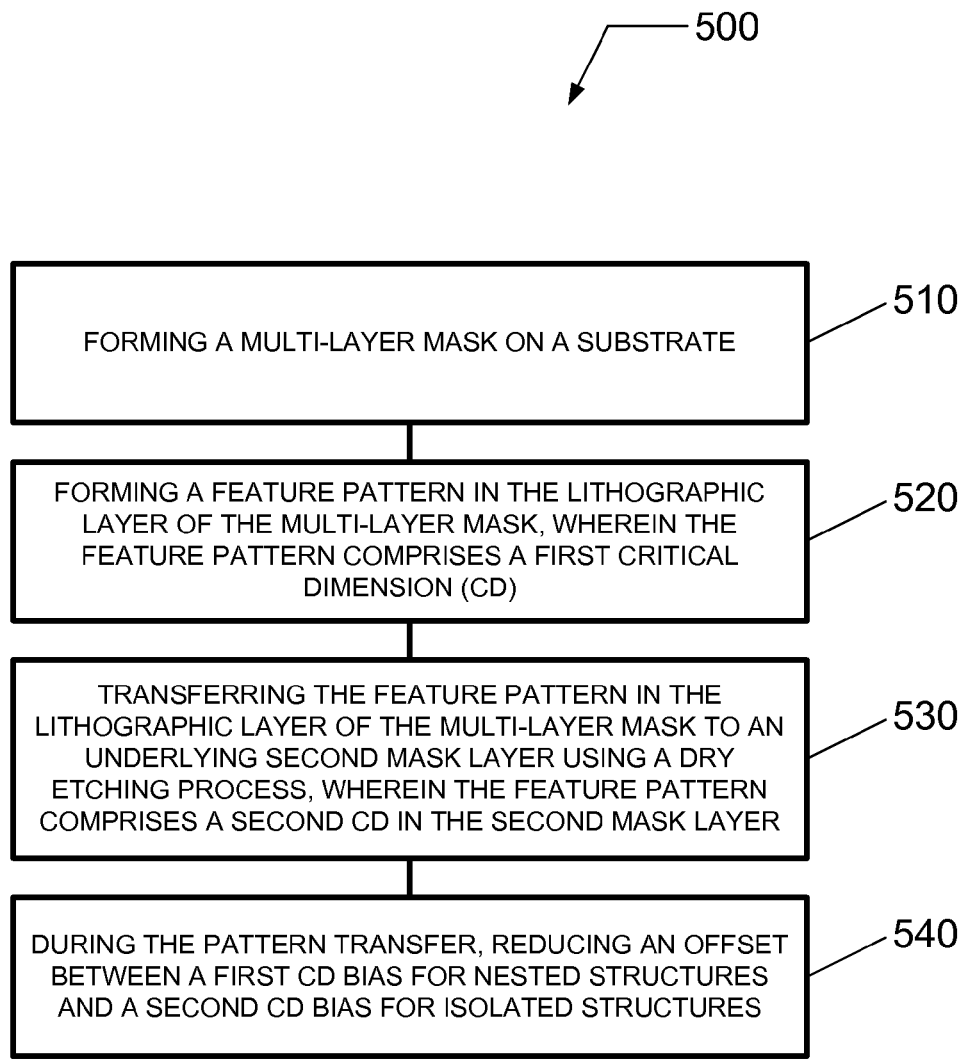
FIG. 2 provides a flow chart illustrating a method of etching a feature in a substrate according to an embodiment.

Therefore, according to an embodiment, a method of etching a feature in a substrate is schematically illustrated in FIGS. 1A through 1D, and is illustrated in a flow chart 500 in FIG. 2. The method begins in 510 with forming a multi-layer mask 120 on a thin film 110, to which a pattern is to be transferred, upon substrate 100. The multi-layer mask 120 comprises a lithographic layer 126, a second mask layer 124 and an optional third mask layer 122.

The substrate 100 may comprise a semiconductor substrate, a wafer, a flat panel display or a liquid crystal display.

The thin film 110 may comprise a conductive layer, a non-conductive layer, or a semi-conductive layer. For instance, the thin film 110 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film 110 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 110 may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous.

For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc.

Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics.

Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 110 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The lithographic layer 126 may comprise a layer of radiation-sensitive material, such as photo-resist. The photo-resist layer may comprise 248 nm (nanometer) resists, 193 nm resists, 157 nm resists, EUV (extreme ultraviolet) resists, or electron beam sensitive resist. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

The second mask layer 124 can comprise a silicon-containing layer, such as a silicon-containing anti-reflective coating (ARC) layer. For example, the second mask layer 124 may comprise a silicon-containing ARC commercially available as Sepr-Shb Aseries SiARC from Shin Etsu Chemical Co., Ltd. The second mask layer 124 may, for example, be applied using spin coating technology, or a vapor deposition process.

The optional third mask layer 122 may comprise an inorganic layer or an organic layer. For example, the optional third mask layer 122 may comprise an organic dielectric layer (ODL). The ODL can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

In 520 and as shown in FIG. 1A, the lithographic layer 126 is imaged with an image pattern. The exposure to EM radiation through a reticle is performed in a dry or wet photolithography system. The image pattern can be formed using any suitable conventional stepping lithographic system, or scanning lithographic system. For example, the photo-lithographic system may be commercially available from ASML Netherlands B. V. (De Run 6501, 5504 DR Veldhoven, The Netherlands), or Canon USA, Inc., Semiconductor Equipment Division (3300 North First Street, San Jose, Calif. 95134). Thereafter, the image pattern is developed in the lithographic layer 126 to form feature pattern 130 having a first critical dimension (CD) 132. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

In 530 and as shown in FIG. 1B, the feature pattern 130 is transferred from the lithographic layer 126 to the second mask layer 124, such as a silicon-containing ARC layer, using a dry plasma etching process. The dry plasma etching process comprises introducing a process gas to the plasma processing system according to a process recipe, forming plasma from the process gas in the plasma processing system according to the process recipe, and exposing the substrate to the plasma.

For example, the dry plasma etching process can comprise establishing a process recipe, introducing a process gas comprising $SF_6$ to a plasma processing system according to the process recipe, forming plasma from the process gas in the plasma processing system according to the process recipe, and exposing the substrate having the second mask layer 124 to the plasma.

The process gas can further comprise an inert gas. Alternatively, the process gas can comprise a noble gas. Alternatively yet, the process gas can comprise argon (Ar).

The process gas can further comprise at least one $C_xF_yH_z$-containing gas, wherein x and y are integers greater than or equal to unity and z is an integer greater than or equal to zero. The $C_xF_yH_z$-containing gas may include any gas containing carbon (C) and fluorine (F) (e.g., a fluorocarbon gas), or any gas containing C, F and hydrogen (H) (e.g., a hydrofluorocarbon gas). For example, the fluorocarbon gas may include $CF_4$, $C_3F_6$, $C_4F_6$, $C_4F_8$, or $C_5F_8$, or a combination of two or more thereof. Additionally, for example, the hydrofluorocarbon gas may include introducing trifluoromethane ($CHF_3$), or difluoromethane ($CH_2F_2$), or both.

In 540 and as shown in FIG. 1B, during the pattern transfer, the first CD 132 for the feature pattern 130 in the lithographic layer 126 is maintained as or reduced to a second CD 142 in the second mask layer 124. The target CD bias, i.e., difference between the first CD 132 and the second CD 142, may be substantially zero, positive, or negative. When forming plasma from the process gas, a process recipe is selected to cause a reduction in an offset between a first critical dimension (CD) bias for nested structures in the feature pattern 130 and a second CD bias for isolated structures in the feature pattern 130, wherein the first CD bias is measured as a first difference between the first CD 132 for nested structures of the feature pattern 130 in the lithographic layer 126 and the second CD 142 for nested structures of the feature pattern in the second mask layer 124 and the second CD bias is measured as a second difference between a first CD 132' (see FIG. 1E) for isolated structures of the feature pattern 130' in the lithographic layer 126 and a second CD 142' for isolated structures of the feature pattern 130' in the second mask layer 124. For example, the process condition can include: (1) selecting a ratio of an amount of the process gas; (2) selecting a process pressure and one or more power levels for forming plasma; and (3) selecting an etch time.

Further details on the influence of the process recipe on reduction of CD bias and CD bias offset are provided below.

Once the feature pattern 130 extends through the thickness of the second mask layer 124, the etch time may be extended in order to increase or decrease the amount of difference between the first CD 132 and the second CD 142. By extending the etch time, the inventor has observed that the plasma chemistry and ion bombardment can enlarge the second CD 142 relative to first CD 132.

As shown in FIG. 1C, the feature pattern 130 having second CD 142 formed in the second mask layer 124 can be transferred to the underlying optional third mask layer 122 to form a third CD 152 in the third mask layer 122 using one or more etching processes. The third CD 152 can be substantially the same as the second CD 142, or it may be less than the second CD 142 as illustrated in FIG. 1C. The one or more etching processes may include any combination of wet or dry etching processes. The dry etching processes may include dry plasma etching processes or dry non-plasma etching processes. For example, the one or more etching processes may include a dry plasma etching process that utilizes plasma formed from a process gas containing $CO_2$. The process gas can further comprise $O_2$, He, and HBr.

Figure 1E:
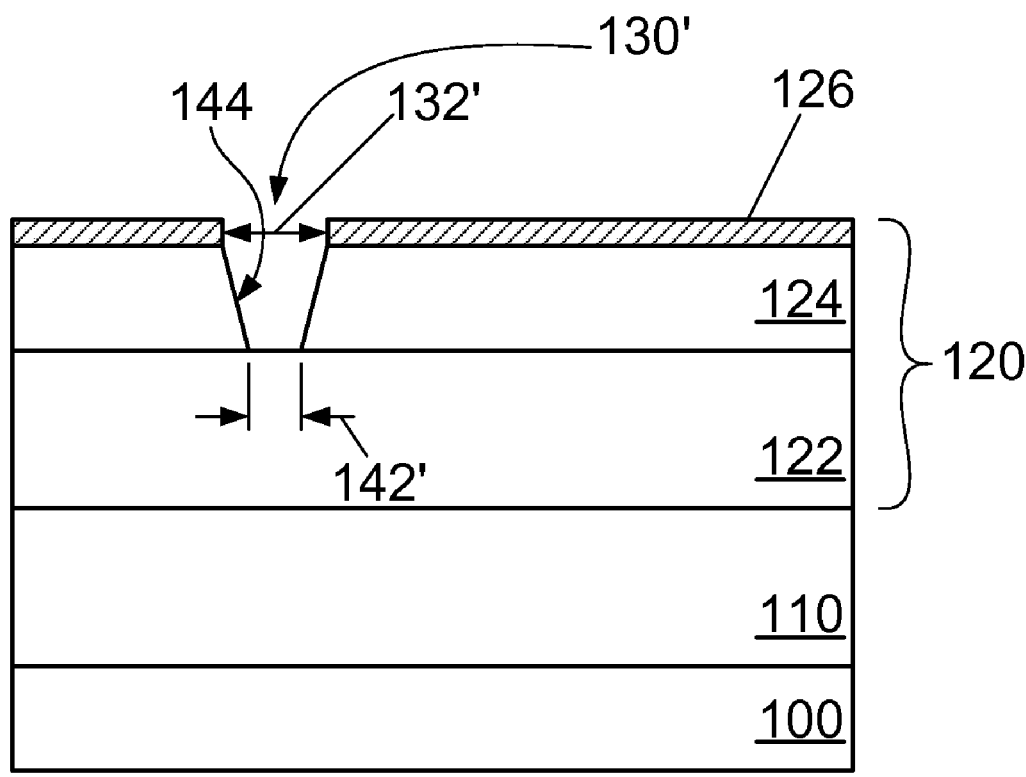

As shown in FIG. 1D, the feature pattern 130 having third CD 152 formed in the optional third mask layer 122 can be transferred to the underlying thin film 110 using one or more etching processes. For example, the one or more etching processes may include any combination of wet or dry etching processes. The dry etching processes may include dry plasma etching processes or dry non-plasma etching processes.

Figure 3:
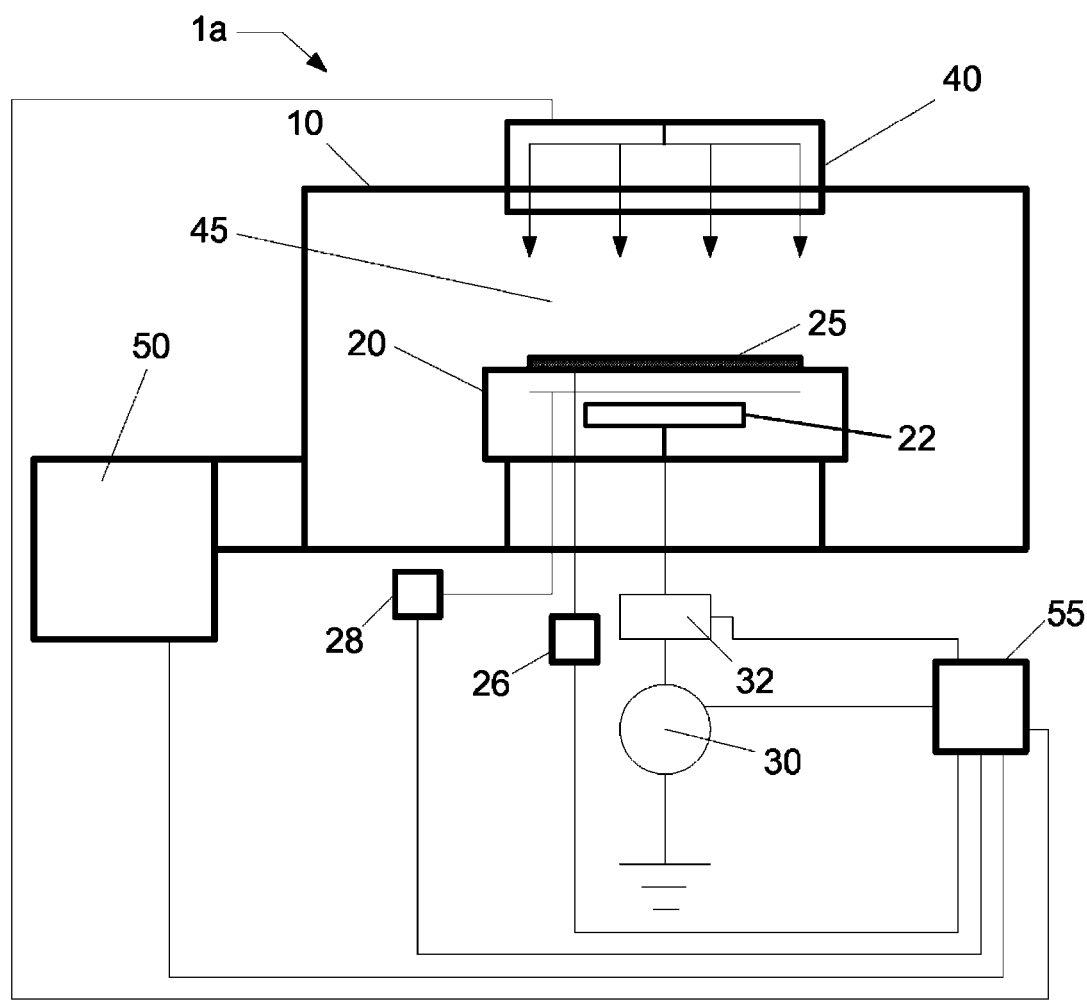
FIG. 3 shows a schematic representation of a processing system according to an embodiment.

According to one embodiment, a processing system 1a configured to perform the above identified process conditions is depicted in FIG. 3 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermoelectric heaters/coolers can be included in the substrate holder 20, as well as the chamber wall of the plasma processing chamber 10 and any other component within the processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 3, substrate holder 20 can comprise an electrode through which RF power is coupled to the processing plasma in processing region 45. For example, substrate holder 20 can be electrically biased at a RF voltage via the transmission of RF power from a RF generator 30 through an optional impedance match network 32 to an electrode 22. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mtorr. For high pressure processing (i.e., greater than about 100 mtorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the processing system 1a, or it can be remotely located relative to the processing system 1a. For example, controller 55 can exchange data with processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 4, processing system 1b can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 3. Moreover, controller 55 can be coupled to magnetic field system 60 in order to regulate the speed of rotation and field strength. The design and implementation of a rotating magnetic field is well known to those skilled in the art.

Figure 4:
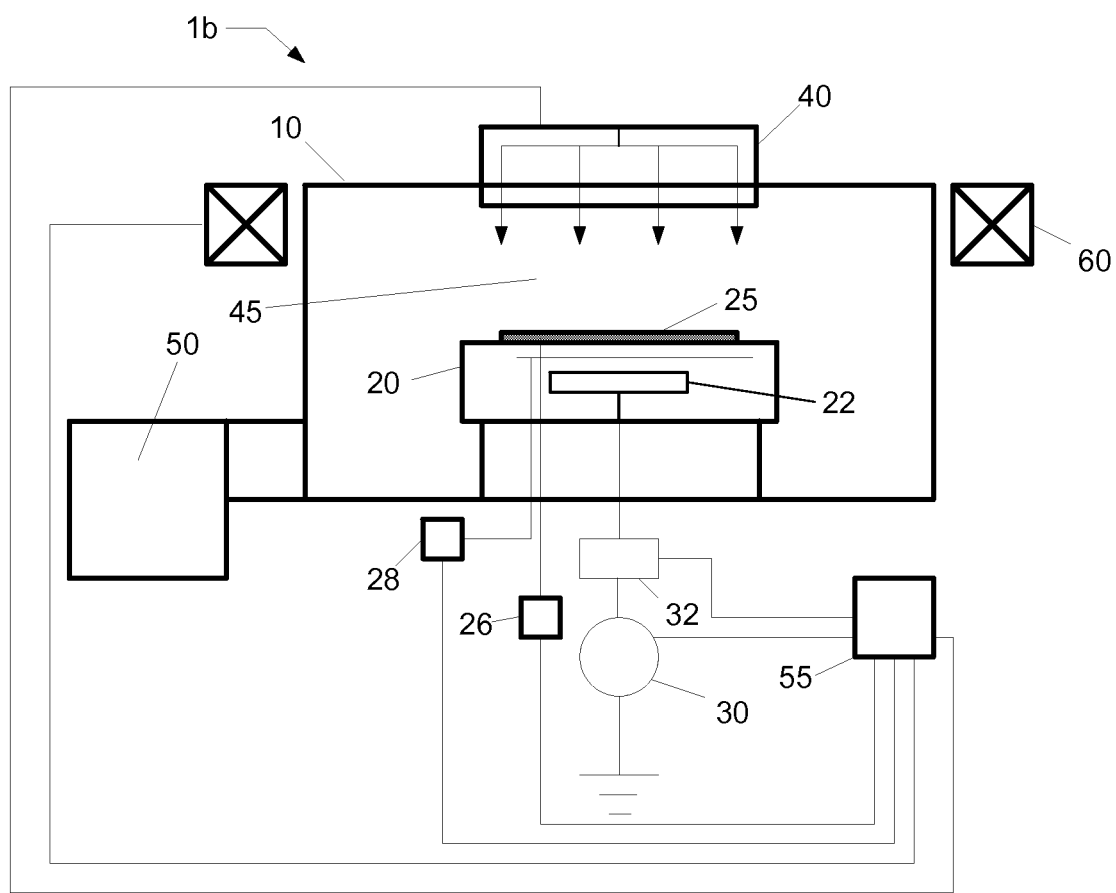
FIG. 4 shows a schematic representation of a processing system according to another embodiment.
Figure 5:
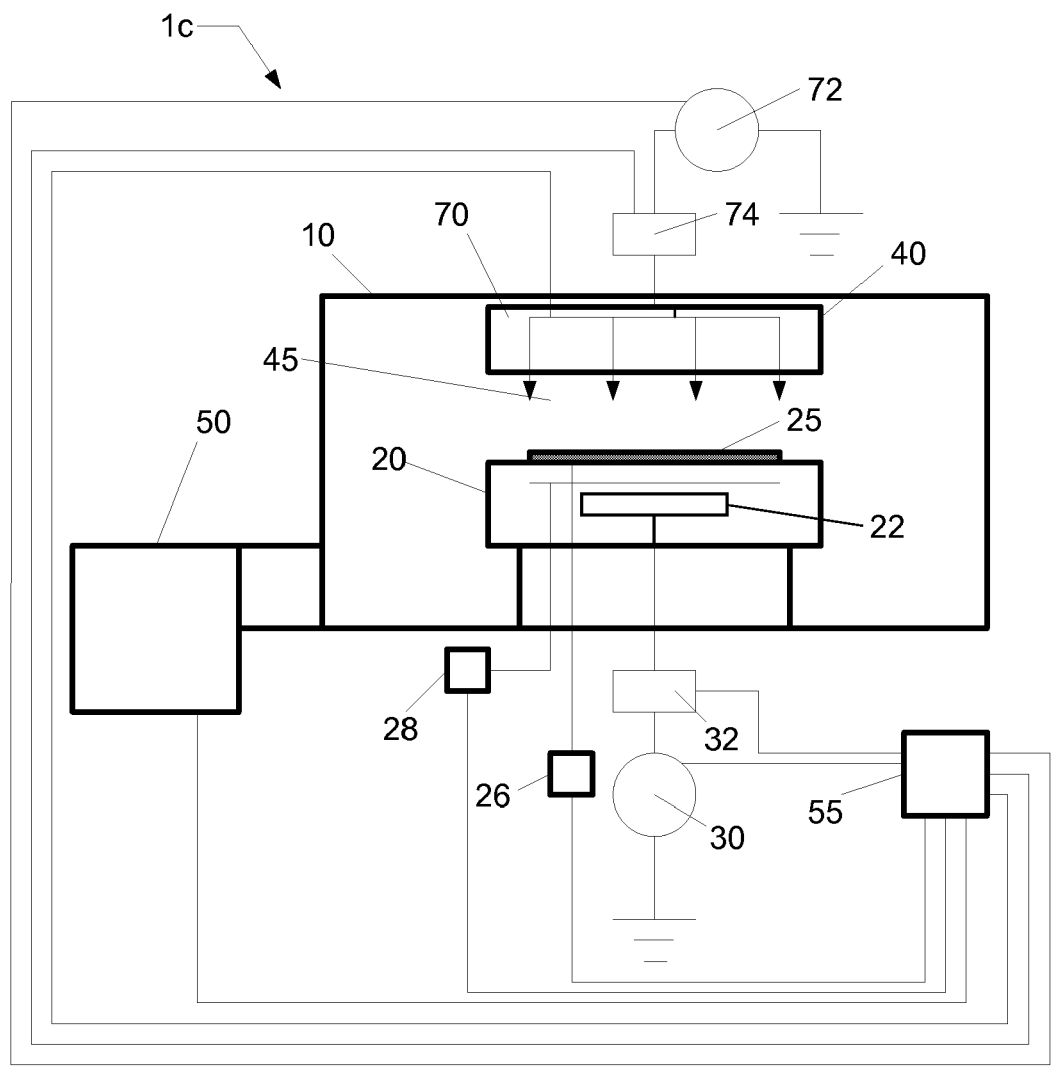
FIG. 5 shows a schematic representation of a processing system according to another embodiment.

In the embodiment shown in FIG. 5, processing system 1c can be similar to the embodiment of FIG. 3 or FIG. 4, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 6:
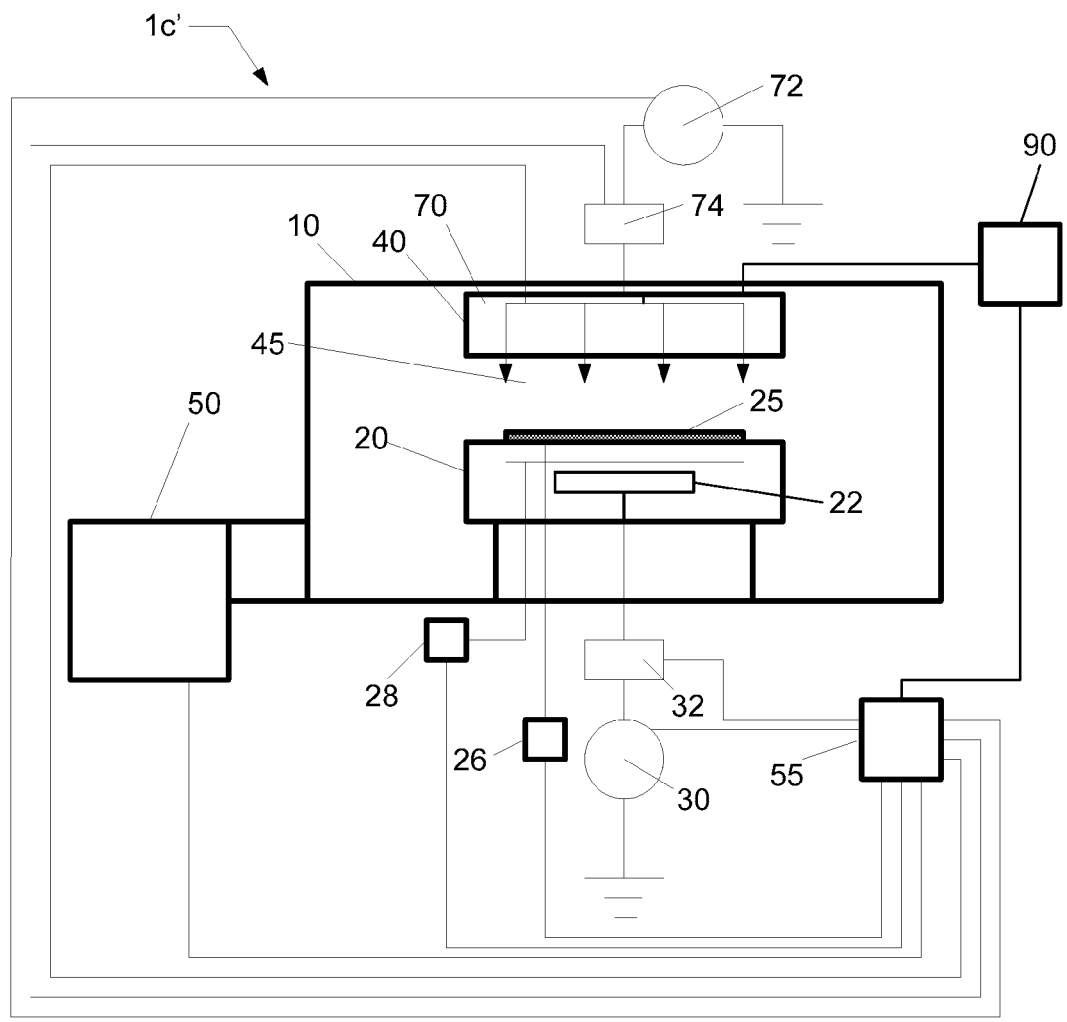
FIG. 6 shows a schematic representation of a processing system according to another embodiment.

In the embodiment shown in FIG. 6, processing system 1c' can be similar to the embodiment of FIG. 5, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring adjusting, or controlling the polarity, current, voltage, or on/off state of the DC power supply 90. Once plasma is formed, the DC power supply 90 facilitates the formation of a ballistic electron beam. An electrical filter may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 7:
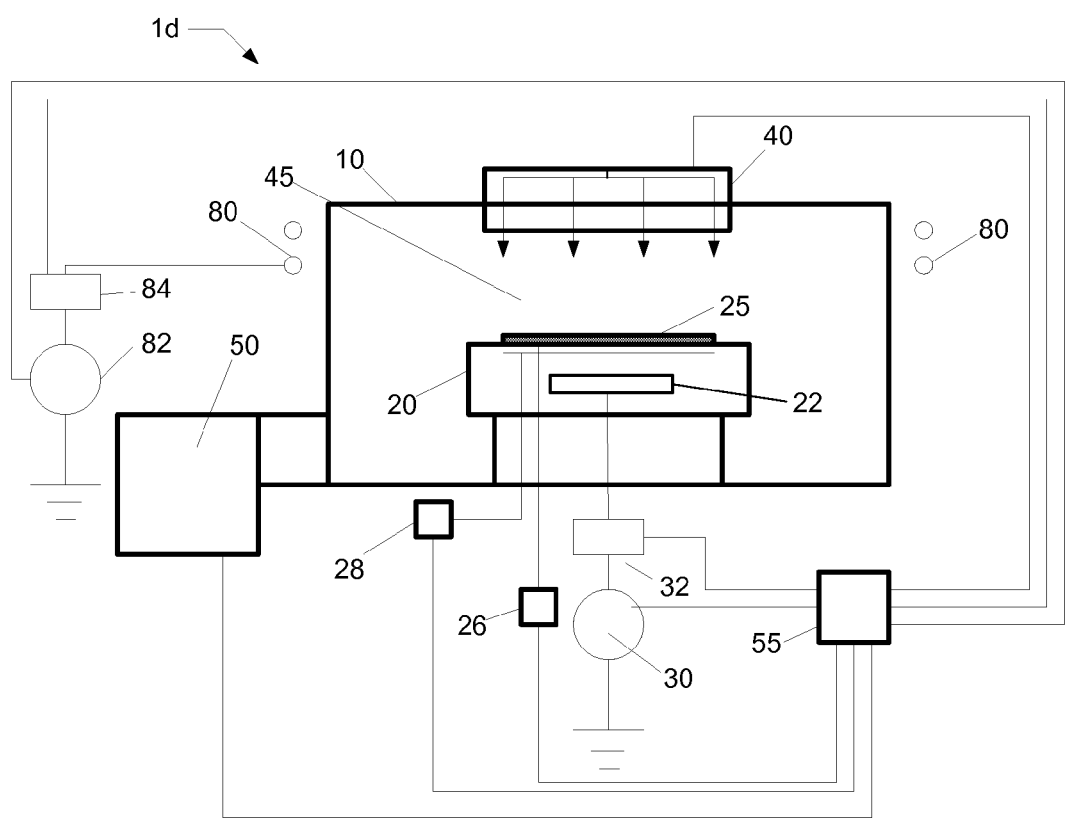
FIG. 7 shows a schematic representation of a processing system according to another embodiment.

In the embodiment shown in FIG. 7, the processing system 1d can be similar to the embodiments of FIGS. 3 and 4, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 8:
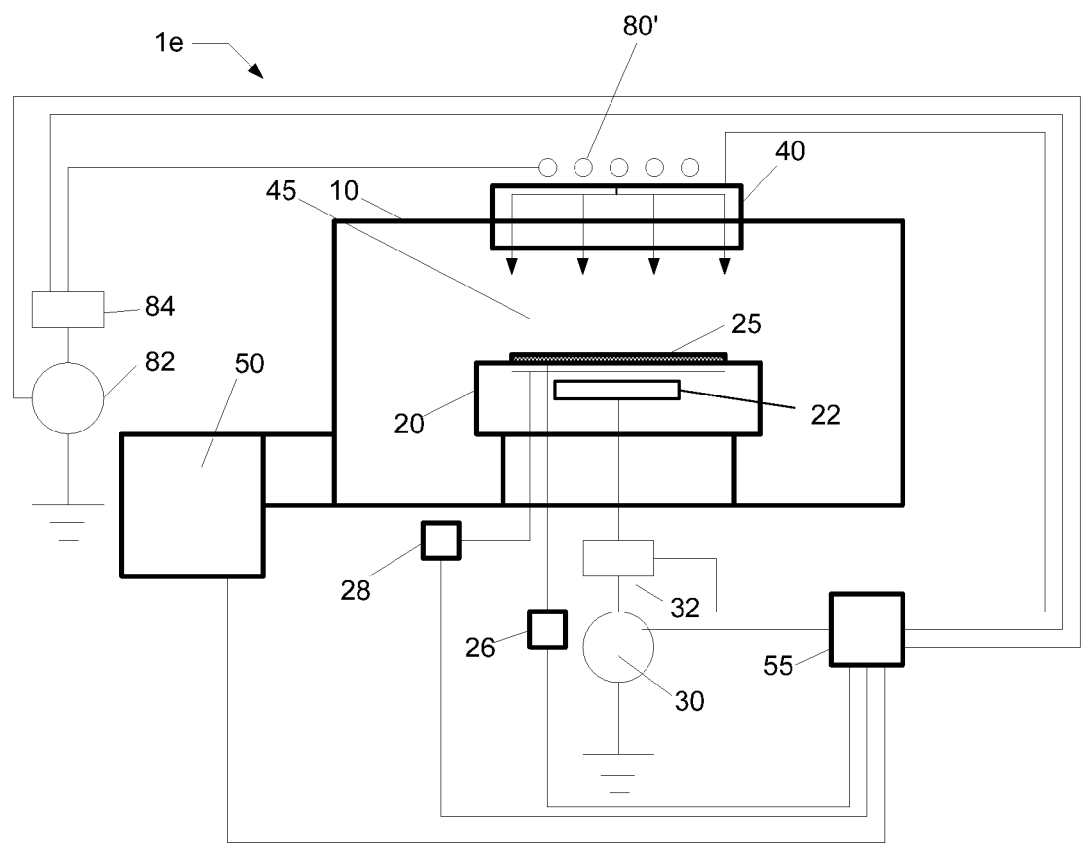
FIG. 8 shows a schematic representation of a processing system according to another embodiment.

In an alternate embodiment, as shown in FIG. 8, the processing system 1e can be similar to the embodiment of FIG. 7, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
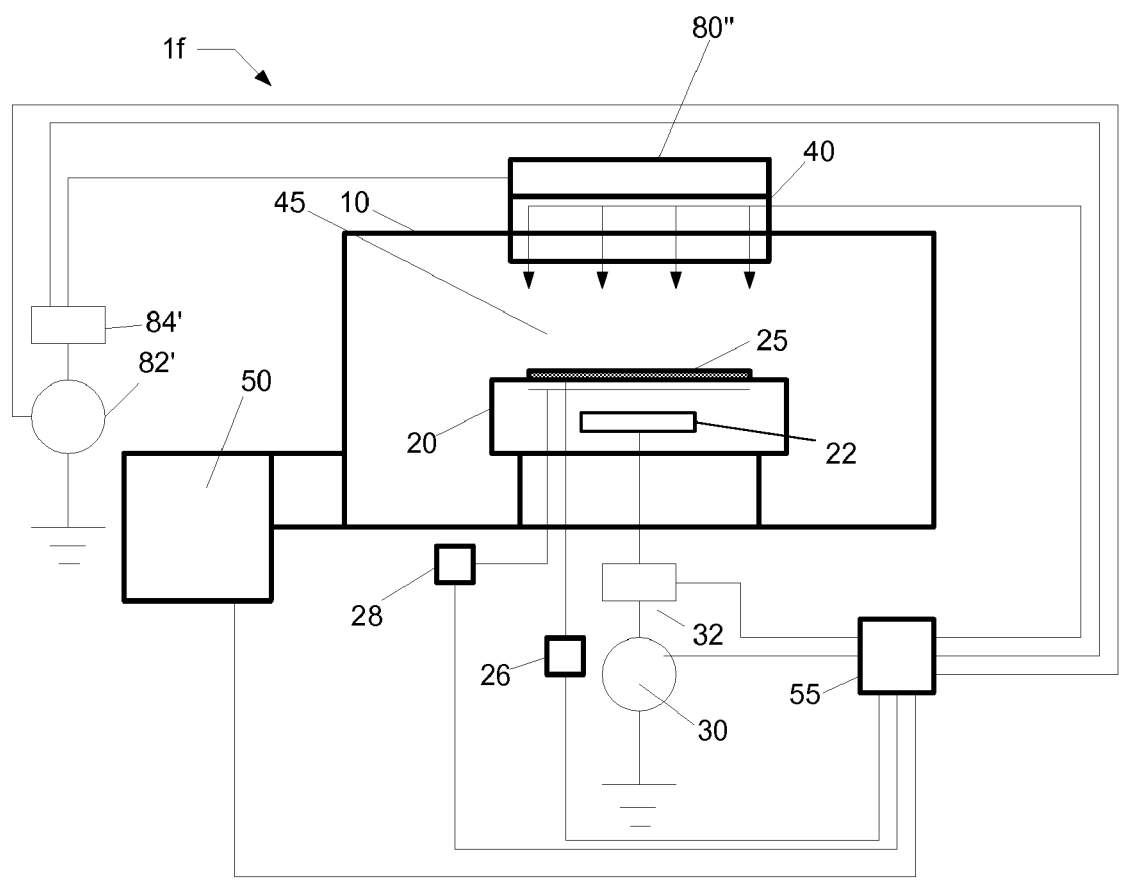
FIG. 9 shows a schematic representation of a processing system according to another embodiment.

In the embodiment shown in FIG. 9, the processing system 1f can be similar to the embodiments of FIGS. 3 and 4, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In the following discussion, a method of etching a feature in a multi-layer mask on a substrate utilizing a dry plasma etching system is presented. For example, the dry plasma etching system can comprise various elements, such as described in FIGS. 3 through 9, and combinations thereof. Furthermore, for example, the multi-layer mask can comprise a patterned multi-layer mask overlying a second mask layer, such as a silicon-containing ARC layer.

In one embodiment, a method of etching a feature pattern in a second mask layer is described, wherein the method uses a process recipe to reduce an offset between a first critical dimension (CD) bias for nested structures in the feature pattern and a second CD bias for isolated structures in the feature pattern. The second mask layer may include a silicon-containing ARC layer.

The process recipe comprises: a process chemistry having $SF_6$, an optional inert gas, and an optional $C_xF_yH_z$-containing gas (e.g., $CH_2F_2$, $CHF_3$, $CF_4$). For example, a process parameter space can comprise a chamber pressure of about 5 to about 1000 mtorr, a $SF_6$ process gas flow rate ranging from about 1 to about 1000 sccm, an optional inert process gas flow rate ranging from about 1 to about 1000 sccm, an optional $C_xF_yH_z$-containing process gas flow rate ranging from about 1 to about 1000 sccm, a first power level to a lower electrode (e.g., electrode 22 in FIG. 6) ranging from about 0 to about 1000 W, an upper electrode DC voltage ranging from about 0 V to about −2500 V, and a second power level to an upper electrode (e.g., element 70 in FIG. 6) ranging from about 0 to about 2000 W. Also, the frequency for upper electrode power can range from about 0.1 MHz to about 200 MHz, e.g., 60 MHz. In addition, the frequency for lower electrode power can range from about 0.1 MHz to about 100 MHz, e.g., 2 MHz.

Alternatively, the chamber pressure may be about 100 mtorr or less. Alternatively, the chamber pressure may be about 50 mtorr or less. Alternatively yet, the chamber pressure may be about 30 mtorr or less.

Alternatively, the first power level may be about 200 W or less. Alternatively yet, the first power level may be about 100 W or less.

Alternatively, the second power level may range from about 100 W to about 500 W. Alternatively yet, the second power level may range from about 100 W to about 300 W.

Alternatively, the process gas flow rate of $SF_6$ may range from about 100 sccm to about 300 sccm.

In another embodiment, a method of etching a feature pattern in a second mask layer and a third mask layer is described, wherein the method uses a first process recipe for transferring the feature pattern to the second mask layer and a second process recipe for transferring the feature pattern to the third mask layer. The second mask layer may include a silicon-containing ARC layer, and the third mask layer may include an ODL. The first and second process recipes are selected to reduce an offset between a first critical dimension (CD) bias for nested structures in the feature pattern and a second CD bias for isolated structures in the feature pattern.

The first process recipe comprises: a process chemistry having $SF_6$, an optional inert gas, and an optional $C_xF_yH_z$-containing gas (e.g., $CH_2F_2$, $CHF_3$, $CF_4$). For example, a process parameter space can comprise a chamber pressure of about 5 to about 1000 mtorr, a $SF_6$ process gas flow rate ranging from about 1 to about 1000 sccm, an optional inert process gas flow rate ranging from about 1 to about 1000 sccm, an optional $C_xF_yH_z$-containing process gas flow rate ranging from about 1 to about 1000 sccm, a first power level to a lower electrode (e.g., electrode 22 in FIG. 6) ranging from about 0 to about 1000 W, an upper electrode DC voltage ranging from about 0 V to about −2500 V, and a second power level to an upper electrode (e.g., element 70 in FIG. 6) ranging from about 0 to about 2000 W. Also, the frequency for upper electrode power can range from about 0.1 MHz to about 200 MHz, e.g., 60 MHz. In addition, the frequency for lower electrode power can range from about 0.1 MHz to about 100 MHz, e.g., 2 MHz.

Alternatively, for the first process recipe, the chamber pressure may be about 100 mtorr or less. Alternatively, the chamber pressure may be about 50 mtorr or less. Alternatively yet, the chamber pressure may be about 30 mtorr or less.

Alternatively, for the first process recipe, the first power level may be about 200 W or less. Alternatively yet, the first power level may be about 100 W or less.

Alternatively, for the first process recipe, the second power level may range from about 100 W to about 500 W. Alternatively yet, the second power level may range from about 100 W to about 300 W.

Alternatively, for the first process recipe, the process gas flow rate of $SF_6$ may range from about 100 sccm to about 300 sccm.

The second process recipe comprises: a process chemistry having $CO_2$, an optional inert gas (e.g. He), an optional oxygen-containing gas (e.g., $O_2$), and an optional halogen-containing gas (e.g., HBr). For example, a process parameter space can comprise a chamber pressure of about 5 to about 1000 mtorr, a $CO_2$ process gas flow rate ranging from about 1 to about 1000 sccm, an optional inert process gas flow rate ranging from about 1 to about 1000 sccm, an optional oxygen-containing process gas flow rate ranging from about 1 to about 1000 sccm, an optional halogen-containing process gas flow rate ranging from about 1 to about 1000 sccm, a first power level to a lower electrode (e.g., electrode 22 in FIG. 6) ranging from about 0 to about 1000 W, an upper electrode DC voltage ranging from about 0 V to about −2500 V, and a second power level to an upper electrode (e.g., element 70 in FIG. 6) ranging from about 0 to about 2000 W. Also, the frequency for upper electrode power can range from about 0.1 MHz to about 200 MHz, e.g., 60 MHz. In addition, the frequency for lower electrode power can range from about 0.1 MHz to about 100 MHz, e.g., 2 MHz.

Alternatively, for the second process recipe, the chamber pressure may be about 100 mtorr or less. Alternatively, the chamber pressure may be about 50 mtorr or less. Alternatively yet, the chamber pressure may be about 30 mtorr or less.

Alternatively, for the second process recipe, the first power level may be about 200 W or less. Alternatively yet, the first power level may be about 100 W or less.

Alternatively, for the second process recipe, the second power level may range from about 100 W to about 1000 W. Alternatively yet, the second power level may range from about 400 W to about 600 W.

Alternatively, for the second process recipe, the process gas flow rate of $CO_2$ may range from about 50 sccm to about 150 sccm. Alternatively, for the second process recipe, the process gas flow rate of $O_2$ may range from about 10 sccm to about 100 sccm. Alternatively, for the second process recipe, the process gas flow rate of He may range from about 100 sccm to about 300 sccm. Alternatively, for the second process recipe, the process gas flow rate of HBr may range from about 10 sccm to about 100 sccm.

In one example, a method of transferring a feature pattern to a silicon-containing ARC layer and an underlying ODL while reducing the offset between a first CD bias for nested structures and a second CD bias for isolated structures is provided. Table 1 provides three process recipes for performing the feature pattern transfer process.

TABLE 1

| Recipe | Step | Pressure (mtorr) | UEL Power (W) | LEL Power (W) | $CO_2$ (SCCM) | $CF_4$ (SCCM) | He (SCCM) | $O_2$ (SCCM) | $CHF_3$ (SCCM) |
|---|---|---|---|---|---|---|---|---|---|
| 1 | Si-ARC 1 | 30 | 250 | 50 | | 55 | | 8 | |
| | Si-ARC 2 | 15 | 500 | 200 | | 80 | | | 50 |
| | ODL-1 | 20 | 500 | 300 | 200 | | | | |
| | ODL-2 | 20 | 500 | 150 | 80 | | 200 | 40 | |
| 2 | Si-ARC | 20 | 200 | 75 | | | | | |
| | ODL | 20 | 500 | 100 | 80 | | 200 | 40 | |
| 3 | Si-ARC | 20 | 200 | 75 | | | | | |
| | ODL | 20 | 500 | 100 | 80 | | 200 | 40 | |

| Recipe | Step | $CH_2F_2$ (SCCM) | $SF_6$ (SCCM) | HBr (SCCM) | Backside Pressure (C/E) (torr) | Temperature (C.) | Time (sec) |
|---|---|---|---|---|---|---|---|
| 1 | Si-ARC 1 | 25 | | | (10/10) | (80/60/20/10) | 30 |
| | Si-ARC 2 | | | | (10/10) | (80/60/20/10) | 80 |
| | ODL-1 | | | | (10/10) | (80/60/20/10) | 30 |
| | ODL-2 | | | 30 | (10/10) | (80/60/20/10) | 72 |
| 2 | Si-ARC | | 200 | | (10/10) | (80/60/20/10) | 56 |
| | ODL | | | 30 | (10/10) | (80/60/20/10) | 148 |
| 3 | Si-ARC | | 200 | | (10/10) | (80/60/15/15) | 54 |
| | ODL | | | 30 | (10/10) | (80/60/15/15) | 150 |

Recipe 1 comprises a two-step silicon-containing ARC layer etch process ("Si-ARC 1", and "Si-ARC 2"), wherein the first step ("SiARC 1") utilizes a process gas having $CF_4$, $O_2$ and $CH_2F_2$ and the second step ("SiARC 2") utilizes a process gas having $CF_4$ and $CHF_3$. Furthermore, Recipe 1 comprises a two-step ODL etch process ("ODL-1", and "ODL-2"), wherein the first step ("ODL-1") utilizes a process gas having $CO_2$ and the second step ("ODL-2") utilizes a process gas having $CO_2$, $O_2$, He, and HBr.

Recipes 2 and 3 comprise a silicon-containing ARC layer etch process ("Si-ARC"), wherein the process utilizes a process gas having $SF_6$. Furthermore, recipes 2 and 3 comprise an ODL etch process ("ODL"), wherein the process utilizes a process gas having $CO_2$, $O_2$, He, and HBr.

For each process step, the etch process is performed in a plasma processing system such as the one shown in FIG. 5. Further, the frequency for RF power to the upper electrode is about 60 MHz, and the frequency for RF power to the lower electrode is about 2 MHz.

Additionally, for each process recipe, Table 1 provides the process condition for each process step, including: pressure (mtorr), RF power to the upper electrode (W), RF power to the lower electrode (W), process gas flow rates (sccm, standard cubic centimeters per minute), center/edge (C/E) (helium) pressure delivered to the backside of the substrate, temperature settings (degrees centigrade, C) for the upper electrode (UEL) (e.g., electrode 70 in FIG. 5), the chamber wall, and the lower electrode center/edge (LEL) (e.g., electrode 22 in FIG. 5), and the etch time (seconds, sec).

TABLE 2

| CD Bias | Recipe | | |
|---|---|---|---|
| | 1 | 2 | 3 |
| Nested | −9.7 | −14.6 | −15.2 |
| Isolated | 7.2 | −6.3 | −7 |
| Offset | 17 | 8.4 | 8.2 |

As shown in Table 2, the CD bias for nested structures and the CD bias for isolated structures is provided as a result of using each process recipe. Each CD bias presented in Table 2 is a measure of the difference between the initial CD in the lithographic layer and the final CD in the ODL. Additionally, the offset in CD bias between nested structures and isolated structures is provided for each process recipe. As observed by the inventors, the offset in CD bias is substantially reduced when using recipe 2 or recipe 3. The primary difference between recipe 2 and recipe 3 is the center-edge temperature setting for the lower electrode.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of dry developing an anti-reflective coating (ARC) layer on a substrate, comprising:
    disposing a substrate comprising a multi-layer mask in a plasma processing system, wherein said multi-layer mask comprises a lithographic layer overlying a silicon-containing ARC layer and wherein said lithographic layer comprises a feature pattern formed therein using a lithographic process;
    establishing a process recipe configured to cause a reduction in an offset between a first critical dimension (CD) bias for nested structures in said feature pattern and a second CD bias for isolated structures in said feature pattern, wherein said first CD bias is measured as a first difference between a first CD for nested structures of said feature pattern in said lithographic layer and a second CD for nested structures of said feature pattern in said silicon-containing ARC layer and said second CD bias is measured as a second difference between a first CD for isolated structures of said feature pattern in said lithographic layer and a second CD for isolated structures of said feature pattern in said silicon-containing ARC layer;
    introducing a process gas to said plasma processing system according to said process recipe, said process gas comprising $SF_6$;
    forming plasma from said process gas in said plasma processing system according to said process recipe; and
    exposing said substrate to said plasma in order to transfer said feature pattern in said lithographic layer to said underlying silicon-containing ARC layer.

2. The method of claim 1, wherein said process gas consists essentially of $SF_6$.

3. The method of claim 1, wherein said process gas consists of $SF_6$.

4. The method of claim 1, wherein said process gas further comprises a noble gas.

5. The method of claim 1, wherein said process gas further comprises at least one $C_xF_yH_z$-containing gas wherein x and y are integers greater than or equal to unity and z is an integer greater than or equal to zero.

6. The method of claim 5, wherein said introducing said process gas further comprises introducing $CF_4$, $C_3F_6$, $C_4F_6$, $C_4F_8$, $C_5F_8$, $CHF_3$, or $CH_2F_2$, or a combination of two or more thereof.

7. The method of claim 1, wherein said process recipe causes the reduction in said offset between said first CD bias and said second CD bias below a value of about 10 nm.

8. The method of claim 1, wherein said process recipe further comprises:
    setting a chamber pressure in said plasma processing system;
    setting a first power level for a first radio frequency (RF) signal applied to a lower electrode within a substrate holder for supporting said substrate; and
    setting a second power level for a second RF signal applied to an upper electrode opposing said lower electrode above said substrate.

9. The method of claim 8, wherein said setting said chamber pressure comprises setting a pressure at approximately 100 mtorr or less.

10. The method of claim 8, wherein said setting said chamber pressure comprises setting a pressure at approximately 50 mtorr or less.

11. The method of claim 8, wherein said setting said chamber pressure comprises setting a pressure at approximately 30 mtorr or less.

12. The method of claim 8, wherein said setting said first power level comprises setting a first power level to less than about 200 W.

13. The method of claim 8, wherein said setting said first power level comprises setting a first power level to less than about 100 W.

14. The method of claim 8, wherein said setting said second power level comprises setting a second power level to about 100 W to about 500 W.

15. The method of claim 8, wherein said setting said second power level comprises setting a second power level to about 100 W to about 300 W.

16. The method of claim 1, wherein said process recipe further comprises:
setting a flow rate of said process gas to a value ranging from about 100 sccm to about 300 sccm.

17. The method of claim 1, further comprising:
forming an organic dielectric layer (ODL) between said multi-layer mask and said substrate; and
transferring said feature pattern in said silicon-containing ARC layer to said ODL using a dry etching process.

18. The method of claim 17, further comprising:
forming a dielectric layer between said ODL and said substrate; and
transferring said feature pattern in said ODL to said dielectric layer using another dry etching process.

19. A method of dry developing a multi-layer mask on a substrate, comprising:
forming said multi-layer mask on said substrate, wherein said multi-layer mask comprises a lithographic layer overlying a silicon-containing ARC layer which is overlying an organic dielectric layer (ODL);
forming a feature pattern in said lithographic layer using a lithographic process;
transferring said feature pattern from said lithographic layer to said silicon-containing ARC layer using a first dry plasma etching process, wherein said first dry plasma etching process comprises introducing a process gas having $SF_6$, forming plasma from said process gas, and exposing said substrate to said plasma;
transferring said feature pattern from said silicon-containing ARC layer to said ODL using a second dry plasma etching process, wherein said second dry plasma etching process comprises introducing a second process gas having $CO_2$, forming a second plasma from said second process gas, and exposing said substrate to said second plasma; and
reducing an offset between a first critical dimension (CD) bias for nested structures in said feature pattern and a second CD bias for isolated structures in said feature pattern, wherein said first CD bias is measured as a first difference between a first CD for nested structures of said feature pattern in said lithographic layer and a second CD for nested structures of said feature pattern in said ODL and said second CD bias is measured as a second difference between a first CD for isolated structures of said feature pattern in said lithographic layer and a second CD for isolated structures of said feature pattern in said ODL.

20. The method of claim 19, wherein said second process gas further comprises $O_2$, He, and HBr.

* * * * *